US010903337B2

(12) United States Patent
Zhang et al.

(10) Patent No.: US 10,903,337 B2
(45) Date of Patent: Jan. 26, 2021

(54) AIR GAP SPACER WITH WRAP-AROUND ETCH STOP LAYER UNDER GATE SPACER

(71) Applicant: International Business Machines Corporation, Armonk, NY (US)

(72) Inventors: Chen Zhang, Albany, NY (US); Kangguo Cheng, Schenectady, NY (US); Xin Miao, Guilderland, NY (US); Wenyu Xu, Albany, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/410,052

(22) Filed: May 13, 2019

(65) Prior Publication Data

US 2019/0280099 A1 Sep. 12, 2019

Related U.S. Application Data

(62) Division of application No. 15/851,149, filed on Dec. 21, 2017, now Pat. No. 10,411,114.

(51) Int. Cl.
*H01L 29/66* (2006.01)
*H01L 29/49* (2006.01)
(Continued)

(52) U.S. Cl.
CPC .... *H01L 29/6656* (2013.01); *H01L 21/28247* (2013.01); *H01L 29/41775* (2013.01);
(Continued)

(58) Field of Classification Search
None
See application file for complete search history.

(56) References Cited

U.S. PATENT DOCUMENTS 6,613,637 B1 * 9/2003 Lee ................. H01L 29/66477
257/E21.409
7,374,986 B2 5/2008 Kim et al.
(Continued)

FOREIGN PATENT DOCUMENTS

| JP | 2003078131 A | 3/2003 |
| KR | 1020130106622 A | 9/2013 |
| TW | I544529 B | 8/2016 |

OTHER PUBLICATIONS

English translation of Japanese Application No. JP2003078131.
English translation of Korean Application No. KR1020130106622.
List of IBM Patents or Patent Applications Treated as Related.

*Primary Examiner* — Long Pham
(74) *Attorney, Agent, or Firm* — Robert Sullivan; Ryan, Mason & Lewis, LLP

(57) ABSTRACT

Semiconductor devices and methods are provided to fabricate FET devices. For example, a semiconductor device can include a functional gate structure on a channel region of a fin structure; and a source/drain region on each side of the functional gate structure. The functional gate structure has an insulator material abutting a portion of the sidewalls of the functional gate structure and the source drain region and the top surface of the fin. The functional gate structure further includes a dielectric top layer. The dielectric top layer seals an air gap between the top surface of the insulator material and the dielectric top layer.

20 Claims, 13 Drawing Sheets

(51) Int. Cl.
   *H01L 29/78* (2006.01)
   *H01L 29/417* (2006.01)
   *H01L 21/28* (2006.01)
   *H01L 21/02* (2006.01)

(52) U.S. Cl.
   CPC .... *H01L 29/41791* (2013.01); *H01L 29/4991* (2013.01); *H01L 29/66545* (2013.01); *H01L 29/66553* (2013.01); *H01L 29/66795* (2013.01); *H01L 29/785* (2013.01); *H01L 21/0217* (2013.01); *H01L 21/02167* (2013.01); *H01L 21/02274* (2013.01)

(56) References Cited

U.S. PATENT DOCUMENTS

| | | | |
|---|---|---|---|
| 7,741,663 B2 | 6/2010 | Hause et al. | |
| 7,804,137 B2 | 9/2010 | Kang et al. | |
| 8,637,384 B2 * | 1/2014 | Ando | H01L 29/785 438/479 |
| 8,637,930 B2 * | 1/2014 | Ando | H01L 29/785 257/347 |
| 9,252,233 B2 | 2/2016 | Hsiao et al. | |
| 9,305,835 B2 | 4/2016 | Alptekin et al. | |
| 9,368,572 B1 * | 6/2016 | Cheng | H01L 27/1248 |
| 9,431,294 B2 | 8/2016 | He et al. | |
| 9,443,982 B1 | 9/2016 | Balakrishnan et al. | |
| 9,608,065 B1 * | 3/2017 | Bergendahl | H01L 27/0886 |
| 9,911,824 B2 * | 3/2018 | Ching | H01L 29/6656 |
| 10,020,400 B2 * | 7/2018 | Cheng | H01L 29/66795 |
| 10,096,693 B2 * | 10/2018 | Ching | H01L 29/6656 |
| 10,134,901 B1 * | 11/2018 | Pawlak | H01L 29/66772 |
| 2006/0148155 A1 | 7/2006 | Coleman | |
| 2012/0276711 A1 | 11/2012 | Yoon et al. | |
| 2016/0111515 A1 | 4/2016 | Besser et al. | |
| 2016/0126131 A1 | 5/2016 | Collaert et al. | |
| 2018/0175162 A1 * | 6/2018 | Ching | H01L 29/66545 |
| 2018/0366453 A1 * | 12/2018 | Carlson | H01L 27/11529 |

* cited by examiner

AIR GAP SPACER WITH WRAP-AROUND ETCH STOP LAYER UNDER GATE SPACER

BACKGROUND

The present application generally relates to semiconductor fabrication techniques and, in particular, techniques for fabricating FET (field effect transistor) devices.

As semiconductor manufacturing technologies continue to evolve toward smaller design rules and higher integration densities (e.g., 14 nanometers (nm) technology node and beyond), integrated circuit devices and components become increasingly smaller, creating challenges in layout formation and device optimization. Currently, FinFET technologies are typically implemented for FET fabrication, as such technologies provide effective complementary metal-oxide-semiconductor (CMOS) scaling solutions for FET fabrication at, and below, the 14 nm technology node. A FinFET device comprises a three-dimensional fin-shaped FET structure which includes at least one vertical semiconductor fin structure formed on a substrate, a gate structure formed over a portion of the vertical semiconductor fin, and source/drain regions formed from portions of the vertical semiconductor fin which extend from both sides of the gate structure. The portion of the vertical semiconductor fin that is covered by the gate structure between the source/drain regions comprises a channel region of the FinFET device. With FinFET and other types of FET devices, scaling is determined, in part, by how closely conductive source/drain and gate contacts can be formed in proximity to each other for a given layout without resulting in electrical shorts. The formation of air-gap spacers in fabricating FET devices involves first etching the original spacer with a reactive ion etching (RIE) technique. However, a direct RIE process could potentially damage the fin under the original spacer.

SUMMARY

Embodiments described herein provide methods of forming semiconductor devices.

For example, one exemplary embodiment includes a method for fabricating a semiconductor device. The method comprises forming a semiconductor structure comprising a functional gate structure with a capping layer on a channel region of a fin structure, wherein the functional gate structure has a first spacer layer and an insulator material abutting sidewalls of the functional gate structure with a top surface of the insulator material in contact with a bottom surface of the first spacer layer; and a source/drain region on each side of the functional gate structure. The method further comprises removing the capping layer and the first spacer layer and exposing the top surface of the insulator material to provide a spacer opening. The method further comprises depositing a dielectric top layer in the spacer opening, wherein the dielectric top layer seals an air gap positioned above each fin, and a bottom surface of the air gap is defined by a top surface of the insulator material.

Another exemplary embodiment includes a semiconductor device which comprises a functional gate structure on a channel region of a fin structure; and a source/drain region on each side of the functional gate structure. The functional gate structure has an insulator material abutting a portion of the sidewalls of the functional gate structure and the source drain region and the top surface of the fin. The functional gate structure further comprises a dielectric top layer. The dielectric top layer seals an air gap between the top surface of the insulator material and the dielectric top layer.

These and other features, objects and advantages of the present invention will become apparent from the following detailed description of illustrative embodiments thereof, which is to be read in connection with the accompanying drawings.

DETAILED DESCRIPTION

Figure 1A:
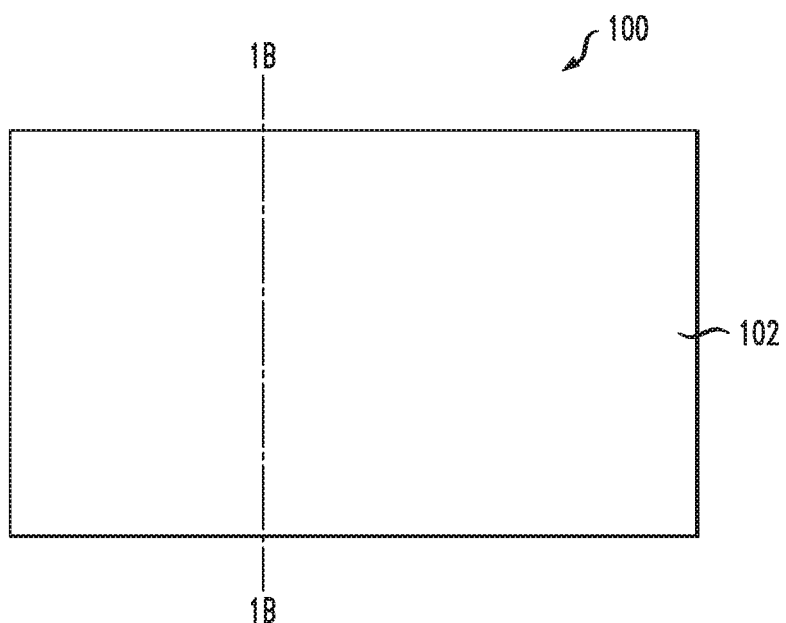
FIG. 1A depicts a plan view of a starting semiconductor substrate after the formation of a set of fins, in accordance with an illustrative embodiment.

Embodiments of the invention will now be discussed in further detail with regard to FET devices having gate contacts formed in active regions overlapping source/drain contacts, as well as methods for fabricating FET devices with gate contacts formed in active regions overlapping source/drain contacts while preventing electrical shorts between overlapping portions of the gate and source/drain contacts. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It is desirable to provide a way of forming an etch stop layer under the original spacer to protect the fin from damage. Accordingly, the structures and methods that are disclosed herein provide a spacer, i.e., a spacer including an air gap, such as a low-k spacer for use in semiconductor devices. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. In some examples, the field effect transistor may be a planar device. In a planar device the gate structure is formed atop an upper surface of the substrate that provides the channel region of the device, in which source and drain regions are present on the substrate on opposing sides of the channel region.

The figures provided in the present disclosure illustrate planar semiconductor devices, but the methods and structures that are disclosed herein, are not limited to only this example, as other semiconductor device geometries are equally applicable. For example, the methods and structure disclosed herein may be applicable to a FinFET semiconductor device. In a FinFET semiconductor device the channel region of the semiconductor device is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

It has been determined that an airgap spacer, such as the spacers formed on the sidewalls of gate structures, are suitable for reducing device capacitance in semiconductor devices, such as FETs. An air gap spacer is a dielectric spacer that includes an enclosed void. As used herein, an "air gap" means a void that is not filled with solid material. It may be filled with a liquid and/or a gas such as air. However, it has been determined that the presence of the air gap within a spacer adjacent to a gate structure can lead to the formation of a passage way that could fill with electrically conductive material during the manufacturing of the semiconductor device including the air gap spacers, which could result in the formation of a short to the gate structures, as well as other electrically conductive features of the device. In some embodiments, the methods and structures disclosed herein reduce the incidence of damaging spacers having air gaps present therein, which can result in an open air gap, by providing a more etch resistant material in the upper portion of the spacer. By positioning a more etch resistant material in the lower portion of the spacer, the fin is less likely to be damaged by etch processes, for example, forming the via openings for contacts to the source and drain region. Further details of the methods and structures of the present disclosure are now discussed with greater detail with reference to FIGS. 1A-13C.

An illustrative embodiment for forming a semiconductor device will be described below with reference to FIGS. 1A-13C. The semiconductor device has self-aligned gate contacts placed laterally overlapping but vertically isolated from both the active region of a FET device and from the adjacent source/drain contacts by dielectric filled recess plugs formed in the upper recessed portions of the source/drain contacts proximate to the gate contacts.

Figure 1B:
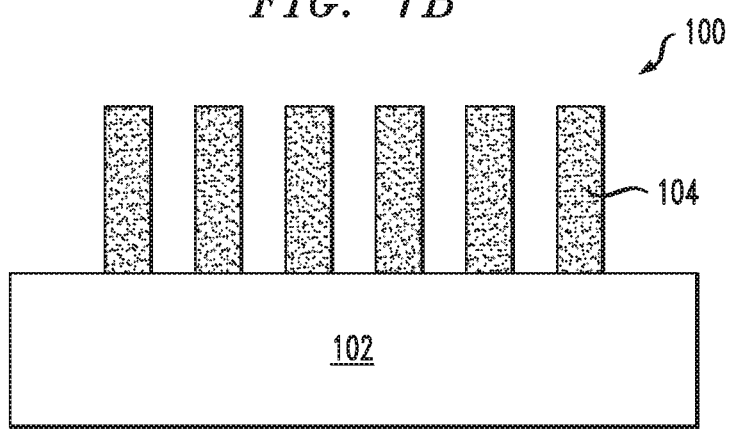
FIG. 1B depicts a cross-sectional view of a starting semiconductor substrate after the formation of a set of fins, in accordance with an illustrative embodiment.

Referring now to the figures, FIG. 1A is a plan view of a starting semiconductor substrate 102 for semiconductor device 100 after the formation of a set of fins 104, and FIG. 1B is a cross-sectional view of the starting semiconductor substrate 102 after the formation of a set of fins, taken along the line 1B-1B of FIG. 1A. In this exemplary embodiment, substrate 102 is composed of silicon. In other embodiments, substrate 102 may be composed of other semiconductor substrate materials, such as III-V semiconductor materials, II-VI semiconductor materials, Ge, and SiGe. The fins are defined on substrate 102 using any standard etching processes know in the art. For example, fin patterns may be formed and etched into substrate 100 using known photolithography techniques.

Figure 2A:
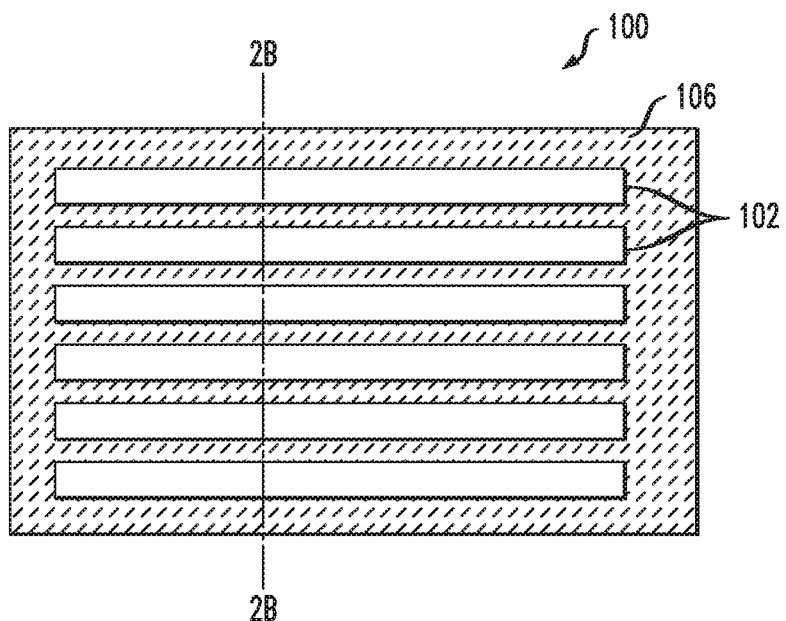
FIG. 2A depicts a plan view of the semiconductor device after the creation of device regions on the starting semiconductor substrate of FIGS. 1A and 1B through shallow trench isolation (STI), in accordance with an illustrative embodiment.
Figure 2B:
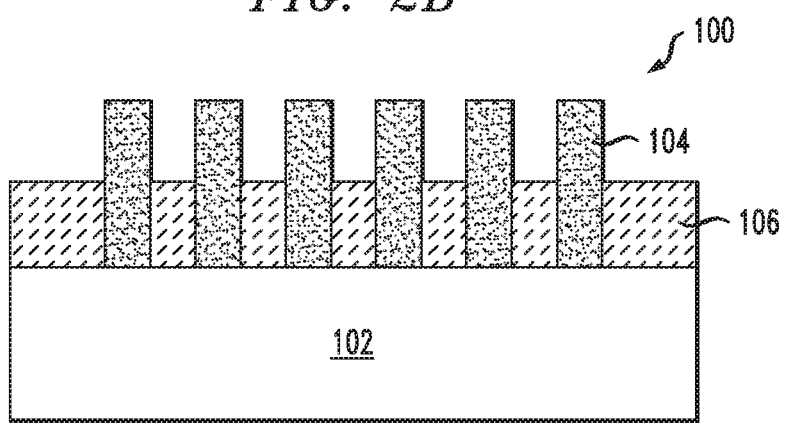
FIG. 2B depicts a cross-sectional view of the semiconductor device, taken along the line 2B-2B of FIG. 2A, in accordance with an illustrative embodiment.

Referring now to FIGS. 2A and 2B, FIG. 2A depicts a plan view of the semiconductor device 100 after the creation of device regions on starting semiconductor substrate 102 of FIGS. 1A and 1B through shallow trench isolation (STI), and FIG. 2B is a cross-sectional view of the semiconductor device 100 after the creation of device regions on starting semiconductor substrate 102 of FIGS. 1A and 1B, taken along the line 2B-2B of FIG. 2A. In this exemplary embodiment, device regions are created through STI within substrate 102. In one embodiment, the shallow trenches are filled with one or more insulating materials 106, such as $SiO_2$ or other oxide materials, to isolate the fins from each other. This prevents electrical leakage between adjacent semiconductor device components, preventing one device region from affecting another device region or shorting out through contact with another. After the deposition of insulating materials 106, a standard planarization process known in the art may be performed, such as chemical mechanical polishing (CMP) and/or grinding.

In an alternative embodiment of the present application (not shown), each fin 104 of the plurality of fins is a semiconductor nanowire whose ends are attached to a corresponding semiconductor material pad region. In yet another embodiment (also not shown), each fin may represent a semiconductor active device region of a planar semiconductor substrate.

Figure 3A:
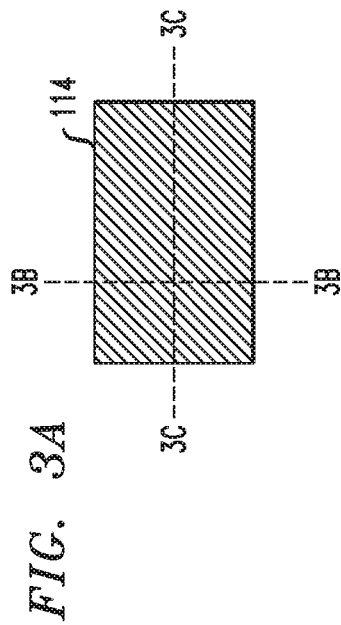
FIG. 3A depicts a plan view of the semiconductor device after the formation of dummy gate structures and a two layer spacer, in accordance with an illustrative embodiment.
Figure 3C:
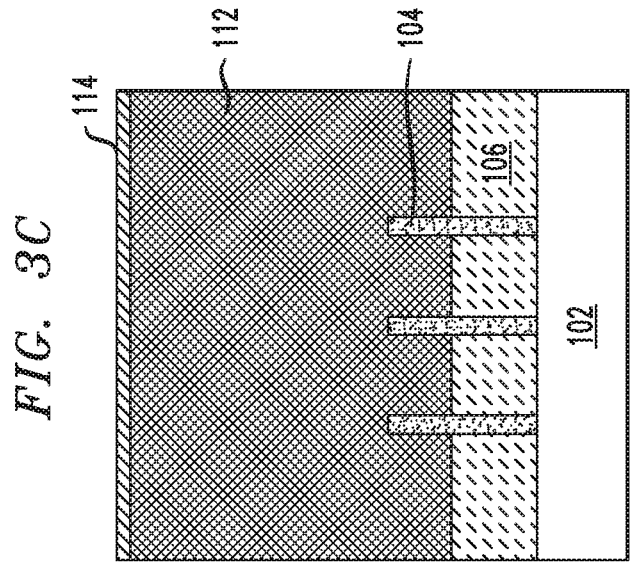
FIG. 3C depicts a cross-sectional view of the semiconductor device, taken along the line 3C-3C of FIG. 3A, in accordance with an illustrative embodiment.
Figure 3B:
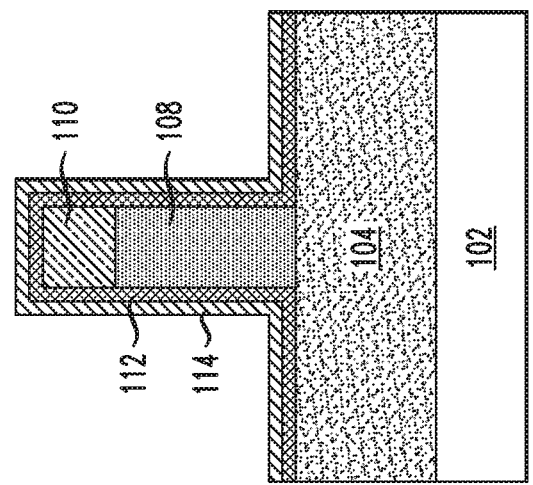
FIG. 3B depicts a cross-sectional view of the semiconductor device, taken along the line 3B-3B of FIG. 3A, in accordance with an illustrative embodiment.

Referring now to FIGS. 3A-3C, FIG. 3A depicts a plan view of the semiconductor device 100 after the formation of gate structure 108, hard mask 110, first spacer layer 112 and second spacer layer 114; FIG. 3B is a cross-sectional view of the semiconductor device after the formation of gate structure 108, hard mask 110, first spacer layer 112 and second spacer layer 114, taken along the line 3B-3B of FIG. 3A; and FIG. 3C is a cross-sectional view of the semiconductor device after the formation of gate structure 108, hard mask 110, first spacer layer 112 and second spacer layer 114, taken along the line 3C-3C of FIG. 3A. Gate structure 108 is formed using a conventional deposition process including, for example, atomic layer deposition (ALD), molecular layer deposition (MLD), chemical vapor deposition (CVD), and physical vapor deposition (PVD), among other known processes. Gate structure 108 may be dummy gate structures or actual gate structures, e.g., a-Si. In this exemplary embodiment, subsequent to the deposition of gate structure 108, a planarization process is performed to remove a portion of gate structure 108. The planarization process may be any conventional planarization process, such as CMP and/or grinding. After planarization, hard mask 110 is deposited on top of gate structure 108. Hard mask material 110 can be, for example, an oxide or nitride material. Hard mask 108 and gate structure 106 are then patterned by lithography and etching. The lithographic and etching processes employed in patterning gate structure 108 may be the same as those mentioned above for patterning the fins. Although only one gate structure is shown, it is contemplated that more than one gate structure can be formed.

Next, first spacer layer 112 is formed on the top surface of insulating layer 106 and along the outer surface, or exterior, of gate structure 106 and hard mask 108. The first spacer layer 112 may be deposited using a deposition process, such as chemical vapor deposition, plasma enhanced chemical vapor deposition (PECVD), metal organic chemical vapor deposition (MOCVD) or other like chemical vapor deposition processes. The first spacer layer 112 can be an insulator spacer material such as a dielectric material, which can be, for example, silicon nitride, silicon oxide, silicon dioxide, silicon oxynitride, a dielectric metal oxide, a dielectric metal nitride, or a combination thereof. Next, second spacer layer 114 is deposited on the outer surface of first spacer layer 112, and can be the same or different material as first spacer layer 112. In one embodiment, first spacer layer 112 is of a different material than second spacer layer 114. For example, first spacer layer 112 can be silicon nitride and second spacer layer 114 is silicon dioxide.

Figure 4A:
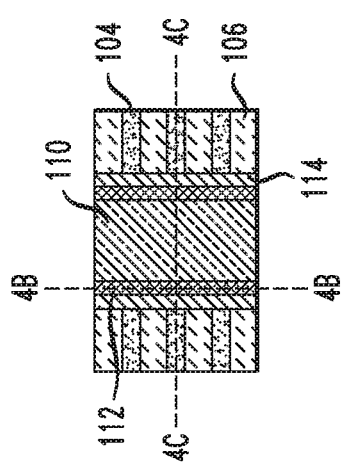
FIG. 4A depicts a plan view of the semiconductor device after selectively removing the horizontal first and second spacer layers, in accordance with an illustrative embodiment.
Figure 4B:
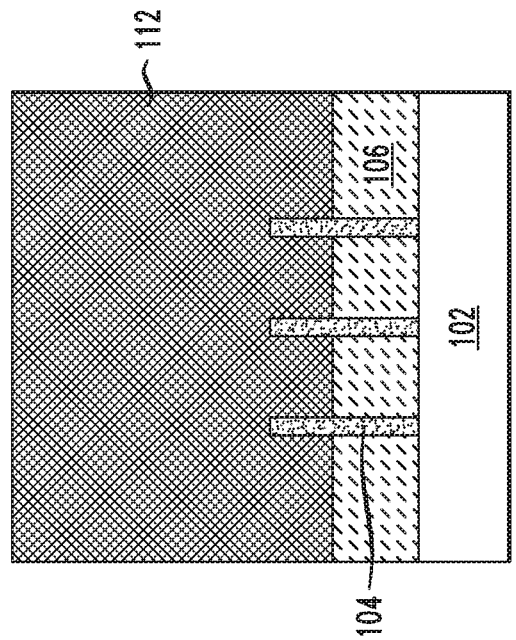
FIG. 4B depicts a cross-sectional view of the semiconductor device, taken along the line 4B-4B of FIG. 4A, in accordance with an illustrative embodiment.
Figure 4C:
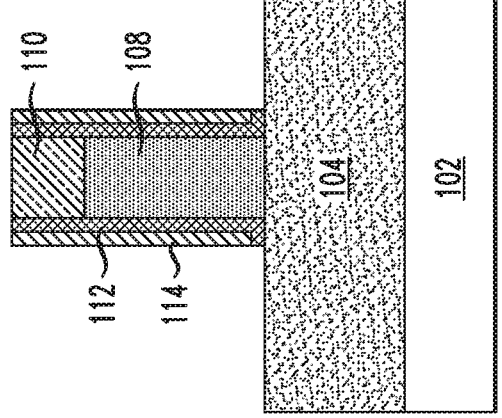
FIG. 4C depicts a cross-sectional view of the semiconductor device, taken along the line 4C-4C of FIG. 4A, in accordance with an illustrative embodiment.

Referring now to FIGS. 4A-4C, FIG. 4A depicts a plan view of the semiconductor device 100 after selectively removing the horizontal portion of first and second spacer layers 112 and 114; FIG. 4B is a cross-sectional view of the semiconductor device taken along the line 4B-4B of FIG. 4A; and FIG. 4C is a cross-sectional view of the semiconductor device taken along the line 4C-4C of FIG. 4A. In this exemplary embodiment, the horizontal portion of first and second spacer layers 112 and 114 can be selectively removed by, for example; an anisotropic etching process such as reactive ion etching or wet etching, with the vertical portions and the first and second spacer layers 112 and 114 remaining. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater.

Figure 5A:
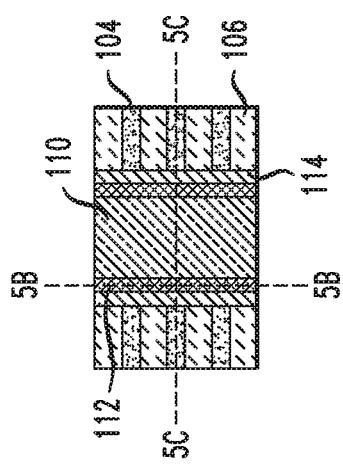
FIG. 5A depicts a plan view of the semiconductor device after forming lateral recessing of the first spacer layer, in accordance with an illustrative embodiment.
Figure 5B:
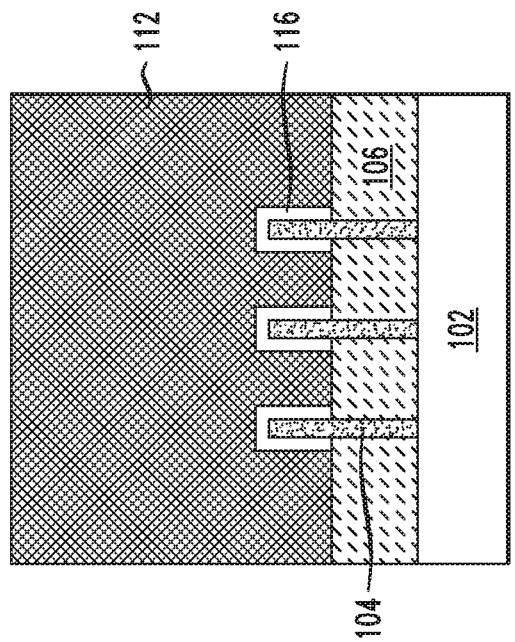
FIG. 5B depicts a cross-sectional view of the semiconductor device, taken along the line 5B-5B of FIG. 5A, in accordance with an illustrative embodiment.
Figure 5C:
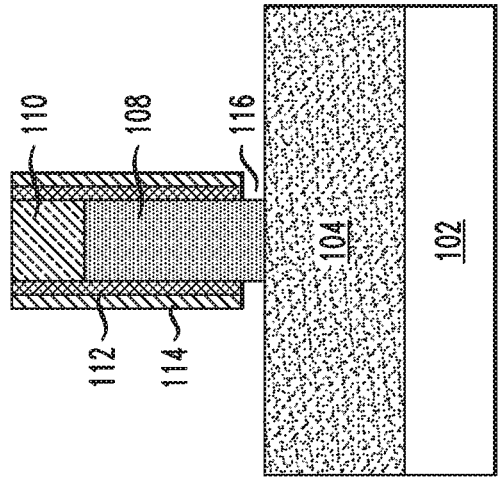
FIG. 5C depicts a cross-sectional view of the semiconductor device, taken along the line 5C-5C of FIG. 5A, in accordance with an illustrative embodiment.

Referring now to FIGS. 5A-5C, FIG. 5A depicts a plan view of the semiconductor device 100 after a lateral recess of first and second spacer layers 112 and 114 forming lateral recessed portion 116; FIG. 5B is a cross-sectional view of the semiconductor device taken along the line 5B-5B of FIG. 5A; and FIG. 5C is a cross-sectional view of the semiconductor device taken along the line 5C-5C of FIG. 5A. In this exemplary embodiment, the oxide/nitride materials for second spacer layer 114 acts as an etch mask. A slight lateral recess is introduced into the first and second spacer layers 112 and 114 using, for example, an isotropic wet etch, to form the lateral recessed portion 116 which exposes the exterior surface of gate structure 108 and fin 104.

Figure 6A:
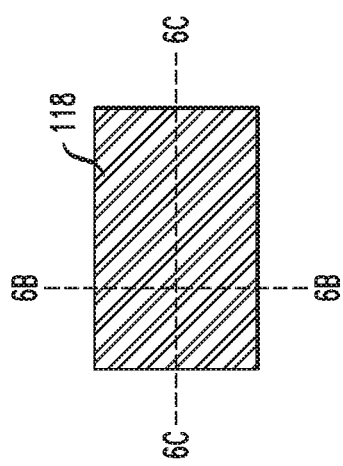
FIG. 6A depicts a plan view of the semiconductor device after depositing a first insulator layer, in accordance with an illustrative embodiment.
Figure 6B:
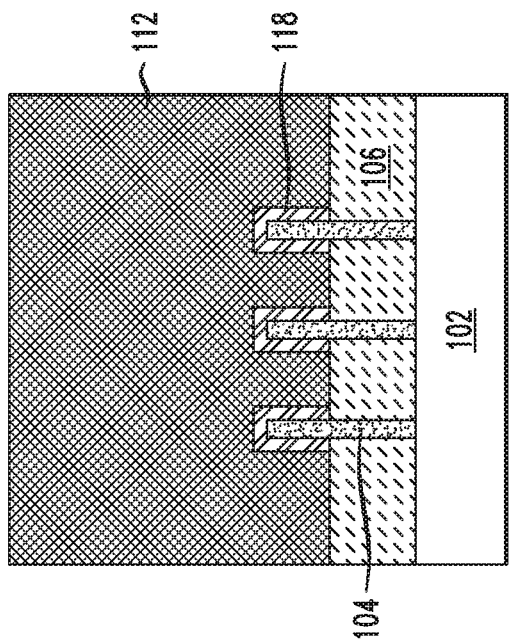
FIG. 6B depicts a cross-sectional view of the semiconductor device, taken along the line 6B-6B of FIG. 6A, in accordance with an illustrative embodiment.
Figure 6C:
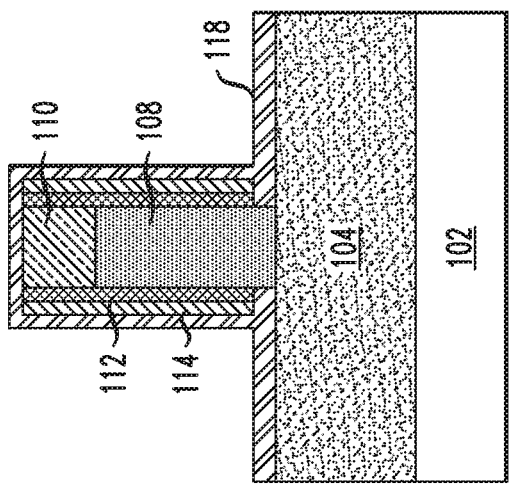
FIG. 6C depicts a cross-sectional view of the semiconductor device, taken along the line 6C-6C of FIG. 6A, in accordance with an illustrative embodiment.

Referring now to FIGS. 6A-6C, FIG. 6A depicts a plan view of the semiconductor device 100 after deposition of first insulator layer 118; FIG. 6B is a cross-sectional view of the semiconductor device taken along the line 6B-6B of FIG. 6A; and FIG. 6C is a cross-sectional view of the semiconductor device taken along the line 6C-6C of FIG. 6A. In this exemplary embodiment, first insulator layer 118 can be silicon oxycarbide (SiCO) based, carbon-doped oxide (CDO), carbon incorporated silicon oxide (SiOC) or Ornithine decarboxylase (ODC). In another preferred embodiment, the insulator material can be silicon carbonitride (SiCN) based, such as nitrogen-doped silicon carbide (NDC). The k value of the SiCO and SiCN based material is preferably smaller than about 5.0. In other embodiments, insulator layer 118 can also be any suitable low-k dielectric material including, for example, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the insulator layer 118 may comprise a single deposited layer of insulating material, or multiple layers of insulating material (e.g., a first layer of a flowable oxide and a second layer of insulating material formed on the first layer). The insulator layer 118 may be deposited using known deposition techniques, such as, for example, chemical vapor deposition (CVD), plasma-enhanced chemical vapor deposition (PECVD), atomic layer deposition (ALD), physical vapor deposition (PVD), or spin-on deposition. Insulator layer 118 is deposited in lateral recessed portion 116 and on the exterior surfaces of insulator layer 106 and second spacer layer 114 and top surfaces of hard mask 110 and first spacer layer 112.

Figure 7A:
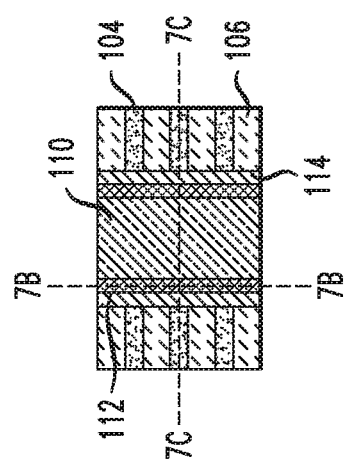
FIG. 7A depicts a plan view of the semiconductor device after a conformal etch back of the first insulator layer, in accordance with an illustrative embodiment.
Figure 7B:
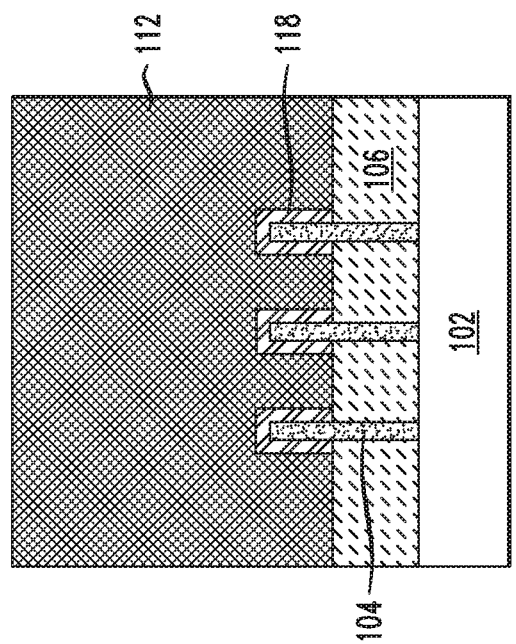
FIG. 7B depicts a cross-sectional view of the semiconductor device, taken along the line 7B-7B of FIG. 7A, in accordance with an illustrative embodiment.
Figure 7C:
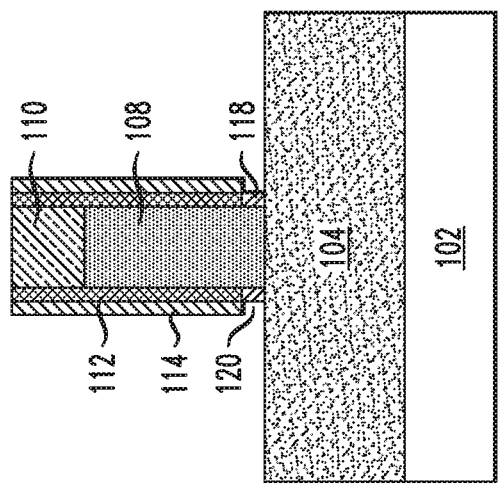
FIG. 7C depicts a cross-sectional view of the semiconductor device, taken along the line 7C-7C of FIG. 7A, in accordance with an illustrative embodiment.

Referring now to FIGS. 7A-7C, FIG. 7A depicts a plan view of the semiconductor device 100 after an etch back process of first insulator layer 118; FIG. 7B is a cross-sectional view of the semiconductor device taken along the line 7B-7B of FIG. 7A; and FIG. 7C is a cross-sectional view of the semiconductor device taken along the line 7C-7C of FIG. 7A. In this exemplary embodiment, first insulator layer 118 is etched back to the level of first spacer layer 112 by, for example, an anisotropic etching process such as reactive ion etching or wet etching. The etch back process is generally difficult to control with precision. The second spacer layer 114 protects the first spacer layer 112 from the etch back, such that the length of these features can be precisely controlled and repeatably produced.

Figure 8A:
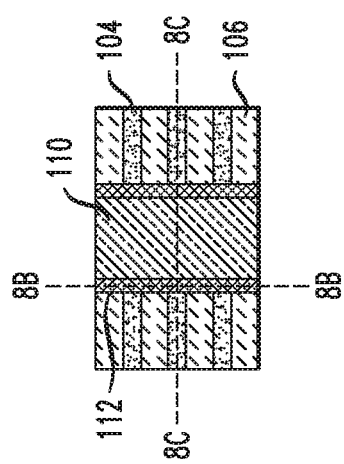
FIG. 8A depicts a plan view of the semiconductor device after selective etching of second spacer layer, in accordance with an illustrative embodiment.
Figure 8B:
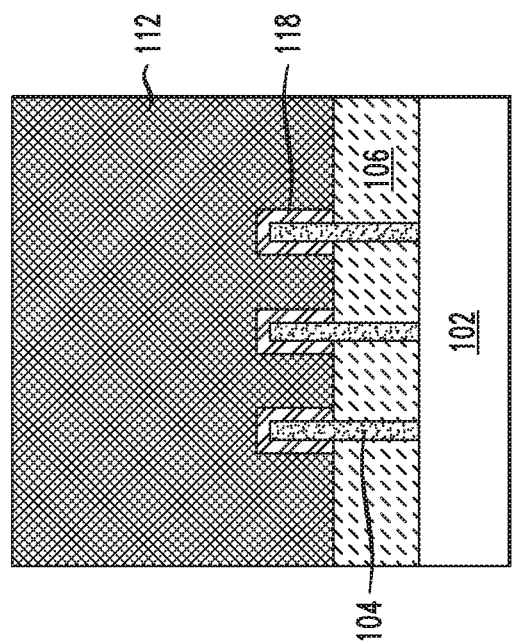
FIG. 8B depicts a cross-sectional view of the semiconductor device, taken along the line 8B-8B of FIG. 8A, in accordance with an illustrative embodiment.
Figure 8C:
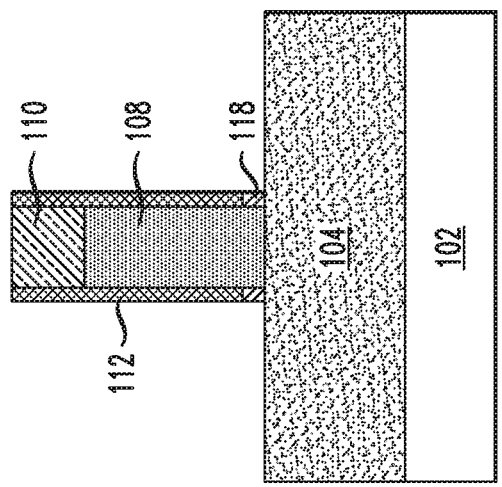
FIG. 8C depicts a cross-sectional view of the semiconductor device, taken along the line 8C-8C of FIG. 8A, in accordance with an illustrative embodiment.

Referring now to FIGS. 8A-8C, FIG. 8A depicts a plan view of the semiconductor device 100 after removal of second spacer layer 114; FIG. 8B is a cross-sectional view of the semiconductor device taken along the line 8B-8B of FIG. 8A; and FIG. 8C is a cross-sectional view of the semiconductor device taken along the line 8C-8C of FIG. 8A. In this exemplary embodiment, second spacer layer 114 is selectively removed by an etching process as described above.

Figure 9A:
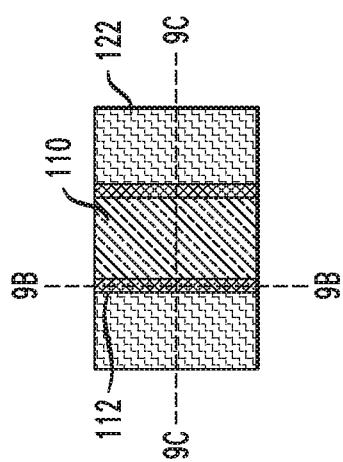
FIG. 9A depicts a plan view of the semiconductor device after forming a source/drain region, in accordance with an illustrative embodiment.
Figure 9B:
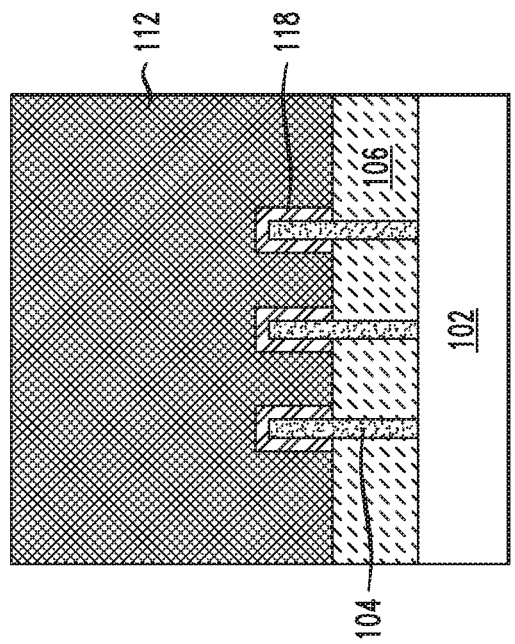
FIG. 9B depicts a cross-sectional view of the semiconductor device, taken along the line 9B-9B of FIG. 9A, in accordance with an illustrative embodiment.
Figure 9C:
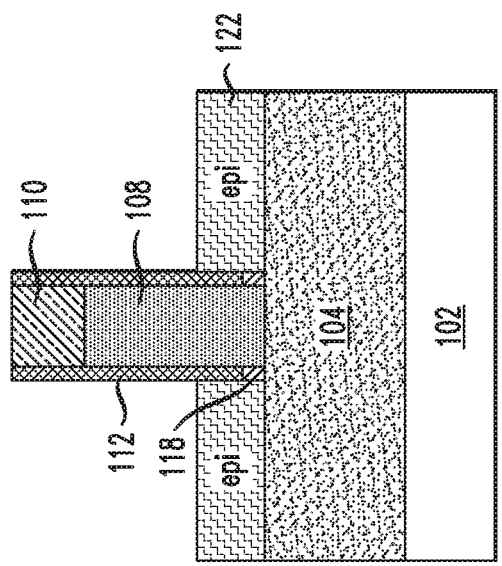
FIG. 9C depicts a cross-sectional view of the semiconductor device, taken along the line 9C-9C of FIG. 9A, in accordance with an illustrative embodiment.

Referring now to FIGS. 9A-9C, FIG. 9A depicts a plan view of the semiconductor device 100 after forming the source/drain (S/D) regions 122; FIG. 9B is a cross-sectional view of the semiconductor device taken along the line 9B-9B of FIG. 9A; and FIG. 9C is a cross-sectional view of the semiconductor device taken along the line 9C-9C of FIG. 9A. In this exemplary embodiment, the S/D regions 122 are formed by growing epitaxial semiconductor material on the exposed surfaces of the S/D regions of the vertical semiconductor fins adjacent to the dummy gate structures. The type of epitaxial material and doping used to form the S/D regions 122 will vary depending on whether the FET devices are P-type or N-type devices. Although not specifically shown in FIG. 9A, the source/drain layers 122 can be epitaxially grown so that adjacent source/drain layers 122 formed on adjacent S/D regions of the vertical semiconductor fins can merge to collectively form a single source/drain layer. In another embodiment, the source/drain regions 122 may be silicide layers that are formed on the exposed surfaces of the S/D regions of the vertical semiconductor fins using known methods.

In an embodiment, the S/D regions 122 may be raised source-drain regions, in which the doped semiconductor material is grown on an upper surface of the insulator layer 106. In another embodiment, the S/D regions 122 may be formed by first forming a trench (not shown) in the insulator layer 106 and then growing the doped semiconductor material in the trench. Examples of semiconductor materials that may be suitable for the epitaxial growth of the S/D regions 122 include, but are not limited to, silicon (single crystal, polysilicon, or amorphous), germanium (single crystal, polycrystalline, or amorphous), or a combination thereof.

After the semiconductor material is grown, it may be doped with dopant atoms using, for example, in-situ doping or ion implantation or in-situ doping during epitaxy. In an embodiment, the semiconductor material may be doped with a p-type dopant such as, for example, boron, aluminum, gallium, indium, or alloys thereof. In another embodiment, the semiconductor material may be doped with a n-type dopant such as, for example, phosphorus, antimony, arsenic, or alloys thereof. After the doping process, the semiconductor material may have a dopant concentration ranging from approximately $1\times10^{19}$ atoms/cm$^3$ to approximately $5\times10^{21}$ atoms/cm$^3$.

After the semiconductor material has been doped, the semiconductor device may be annealed to activate the dopant atoms and to complete the formation of the S/D regions 122. In an embodiment, the annealing process may include subjecting the semiconductor device to an elevated temperature, ranging from approximately 800° C. to approximately 1250° C. for approximately 1 ms to approximately 500 ms. In another embodiment, the annealing process may be a rapid thermal anneal (RTA). In yet another embodiment, the annealing process may be a millisecond anneal such as a laser spike anneal or a flash lamp anneal.

Figure 10A:
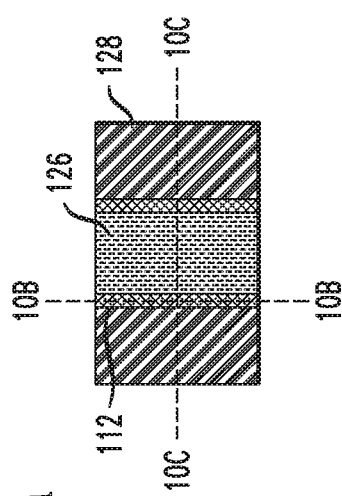
FIG. 10A depicts a plan view of the semiconductor device after forming a replacement metal gate and trench contact, in accordance with an illustrative embodiment.
Figure 10B:
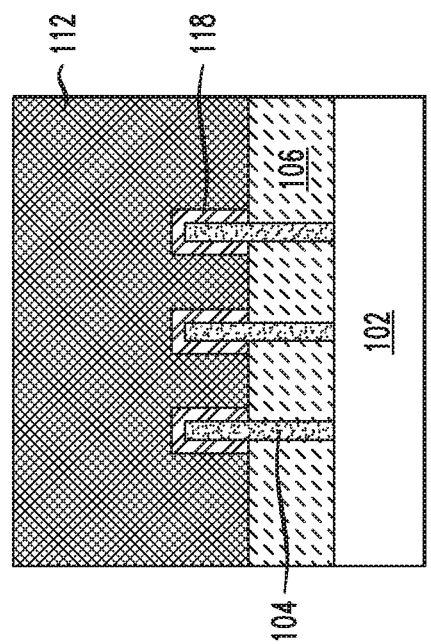
FIG. 10B depicts a cross-sectional view of the semiconductor device, taken along the line 10B-10B of FIG. 10A, in accordance with an illustrative embodiment.
Figure 10C:
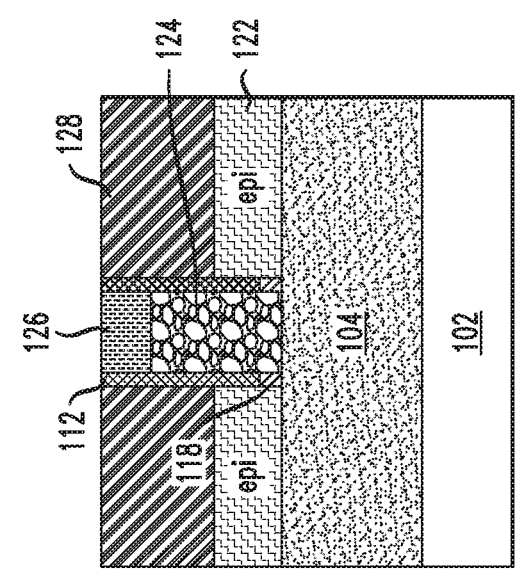
FIG. 10C depicts a cross-sectional view of the semiconductor device, taken along the line 10C-10C of FIG. 10A, in accordance with an illustrative embodiment.

Referring now FIGS. 10A-10C, FIG. 10A depicts a plan view of the semiconductor device 100 after forming a replacement metal gate (RMG) structure and trench contact; FIG. 10B is a cross-sectional view of the semiconductor device 100 taken along the line 10B-10B of FIG. 10A; and FIG. 10C is a cross-sectional view of the semiconductor device taken along the line 10C-10C of FIG. 10A. In this exemplary embodiment, a replacement gate process in accordance with aspects of the present invention is carried out in which a sacrificial gate structure is initially formed on the device, and later replaced with a metal gate structure that produces a functional gate structure. The functional gate structure functions to switch the semiconductor device from an "on" to an "off" state, and vice versa. This process sequence may also be referred to as a gate last process sequence. The gate last process sequence allows for device features, such as, e.g., epitaxial growth of source and drain regions, to be formed while the sacrificial gate structure is in place and before forming the functional gate structure. This provides that the functional gate structure is not subjected to certain process conditions that the sacrificial gate structure is subjected to.

The replacement gate process includes the removal of the gate structure 108 and hard mask material 110 using conventional etching processes, e.g., reactive ion etching. In embodiments, the dummy structure and hard mask material can be removed in separate etching steps, reactive to each material. In accordance with aspects of the present invention, a mask is not required to remove these materials. In one embodiment, the replacement metal gate structure is formed by depositing one or more conformal layers of gate dielectric material over the surface of the semiconductor structure, depositing a metal gate material on the conformal dielectric layer and then depositing one or more layers of dielectric material over the metal gate material. A planarization process (e.g., CMP) is then performed to polish the surface of the semiconductor structure down to the first spacer layer 112, thereby removing the overburden portions of the gate dielectric and conductive materials, and forming the gate cap layer 126 and metal gate region 124 of the metal gate structures.

The conformal gate dielectric layer is formed with any suitable dielectric material including, for example, nitride, oxynitride, or oxide or a high-k dielectric material having a dielectric constant of about 3.9 or greater. In particular, the gate dielectric material can include high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, and aluminum. The high-k dielectric material layer may be formed by suitable deposition processes, for example, CVD, PECVD, ALD, PVD, chemical solution deposition or other like processes. The thickness of the high-k dielectric material may vary depending on the deposition process as well as the composition and number of high-k dielectric materials used.

The metal gate material can include any known metal gate material known to one skilled in the art, e.g., tantalum (Ta) and tantalum nitride (TaN). The metal gate material may be formed via known deposition techniques, such as atomic layer deposition, chemical vapor deposition, or physical vapor deposition. It should be appreciated that a chemical mechanical planarization (CMP) process can be applied to the top surface.

Additionally, the replacement metal gate can be comprised of work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides).

The functional gate structure (also referred to as RMG structure) may be capped with a silicon nitride layer as gate cap layer 126. Alternatively, gate cap layer 126 is formed with any suitable dielectric material including, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

Following the formation of the replacement metal gate structure, a trench contact 128 is formed with an electrically conductive fill material. The electrically conductive fill material may be formed using a deposition method, such as CVD or PVD. Examples of PVD methods suitable for forming the electrically conductive fill material include sputtering, plating, electroplating, electroless plating, and combinations thereof. The electrically conductive fill material may include, but is not limited to: tungsten, copper, aluminum, silver, gold and alloys thereof. Following deposition, the upper surface of the trench contact 128 may be planarized, e.g., planarized by chemical mechanical planarization (CMP).

Figure 11A:
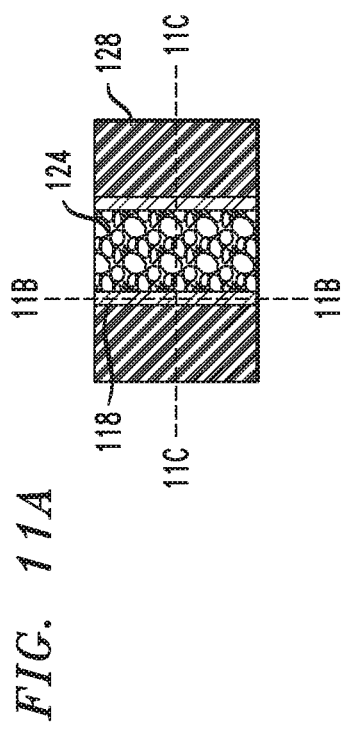
FIG. 11A depicts a plan view of the semiconductor device after selectively etching the first spacer layer, in accordance with an illustrative embodiment.
Figure 11B:
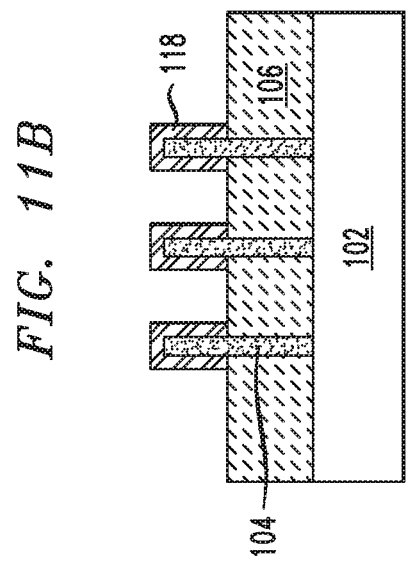
FIG. 11B depicts a cross-sectional view of the semiconductor device, taken along the line 11B-11B of FIG. 11A, in accordance with an illustrative embodiment.
Figure 11C:
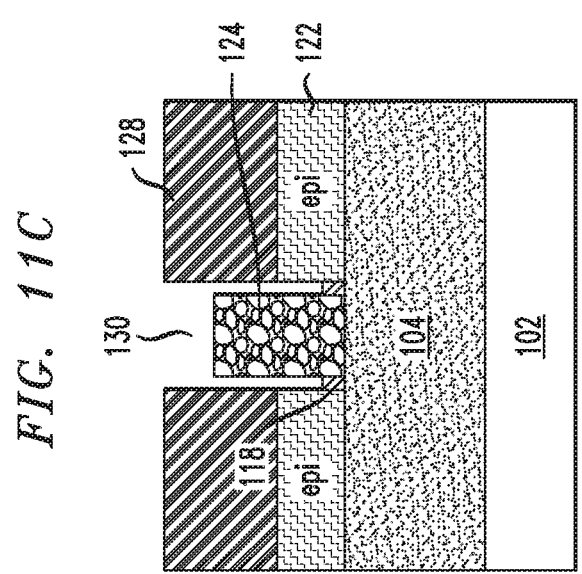
FIG. 11C depicts a cross-sectional view of the semiconductor device, taken along the line 11C-11C of FIG. 11A, in accordance with an illustrative embodiment.

Referring now FIGS. 11A-11C, FIG. 11A depicts a plan view of the semiconductor device 100 after a selective etch process; FIG. 11B is a cross-sectional view of the semiconductor device 100 taken along the line 11B-11B of FIG. 11A; and FIG. 11C is a cross-sectional view of the semiconductor device taken along the line 11C-11C of FIG. 11A. In this exemplary embodiment, selective etching of gate capping layer 126 and first spacer layer 112 is carried out to form opening 130, in which insulator layer 118 acts as an etch stopper. The selective etching of gate capping layer 126 and first spacer layer 112 can be carried out by known techniques, e.g., reactive ion etching.

Figure 12A:
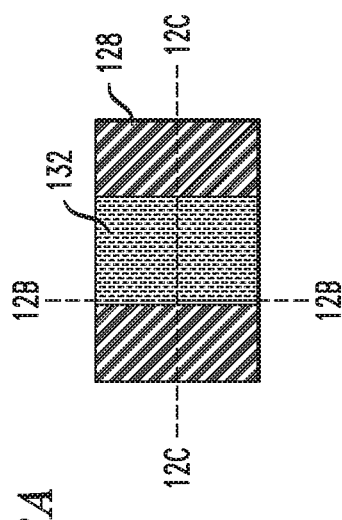
FIG. 12A depicts a plan view of the semiconductor device after forming an air gap spacer in the replacement metal gate, in accordance with an illustrative embodiment.
Figure 12B:
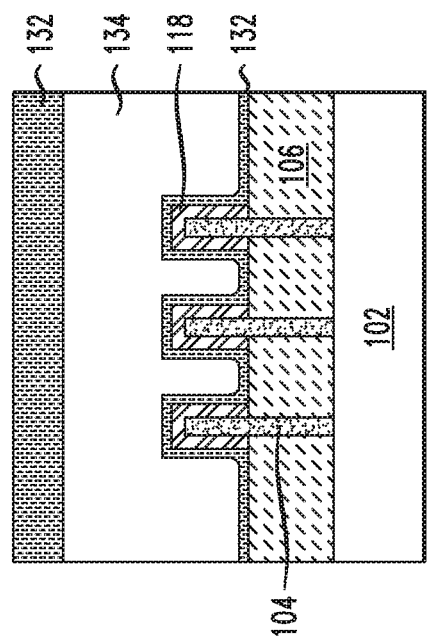
FIG. 12B depicts a cross-sectional view of the semiconductor device, taken along the line 12B-12B of FIG. 12A, in accordance with an illustrative embodiment.
Figure 12C:
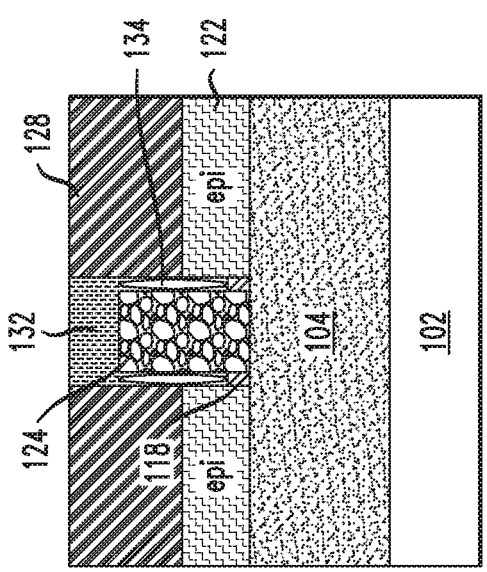
FIG. 12C depicts a cross-sectional view of the semiconductor device, taken along the line 12C-12C of FIG. 12A, in accordance with an illustrative embodiment.

Referring now FIGS. 12A-12C, FIG. 12A depicts a plan view of the semiconductor device 100 after forming an air gap 134 after depositing dielectric top layer 132 in the functional gate structure; FIG. 12B is a cross-sectional view of the semiconductor device 100 taken along the line 12B-12B of FIG. 12A; and FIG. 12C is a cross-sectional view of the semiconductor device taken along the line 12C-12C of FIG. 12A. In this exemplary embodiment, air gaps 134 are formed within portions of the gate dielectric deposited in the opening that was formed during the process described in FIG. 11A-11C. Air gap 134 may be comprised of a gas from the ambient air, or may be comprised of an inert gas, e.g., nitrogen gas, helium, etc. In one embodiment, air gap 134 has a k value less than or equal to about 1.5.

For example, the air gaps shown in FIG. 12A-12C, such as air gap 134, may be formed via a single-step dielectric deposition process or a two-step dielectric deposition process. The dielectric 132 can be, for example, a nitride dielectric such as SiN or SiBCN. In the single-step deposition process, an air gap is formed with a specific thickness and conformality associated with a single dielectric deposition. Thus, the single-step dielectric deposition process does not necessarily provide for adjusting the height of air gaps and controlling the shape and/or dimensions of the air gaps. For example, dielectric top layer 132 can be deposited using a relatively low temperature (e.g., 350° C.) PECVD process. With the deposition of the dielectric top layer 132, the air gap 134 is sealed between the dielectric top layer 132 and the top surface of the insulator layer 118.

However, the two-step dielectric deposition process provides increased flexibility over the single-step deposition process with respect to height adjustment and shape and/or dimension control. The first step of the two-step dielectric deposition process is providing an ultrathin conformal dielectric deposition (e.g., a dielectric deposition having a thickness of about 1 to 10 nanometers (nm) and a conformality greater than or equal to about 70%) to form a protective sidewall layer. The second step of the two-step dielectric deposition process is providing a thicker nonconformal dielectric deposition (e.g., a dielectric deposition having a thickness of about 3 to 100 nm and having a conformality less than or equal to about 40%) to pinch off the top surface to form the air gaps. The height of an air gap having a specific opening and aspect ratio is adjusted by varying the thickness and/or conformality of the dielectric deposition(s). Accordingly, the height of the air gaps may be adjusted by thickness and/or conformal modulation. The air gap 134 can have a width of about 5 nm to about 10 nm, or about 6 nm to about 8 nm.

Figure 13A:
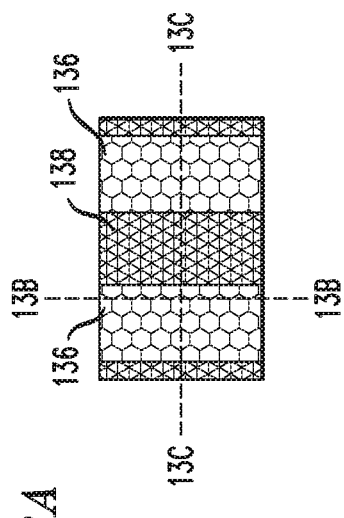
FIG. 13A depicts a plan view of the semiconductor device after further processing to form contacts, in accordance with an illustrative embodiment.
Figure 13B:
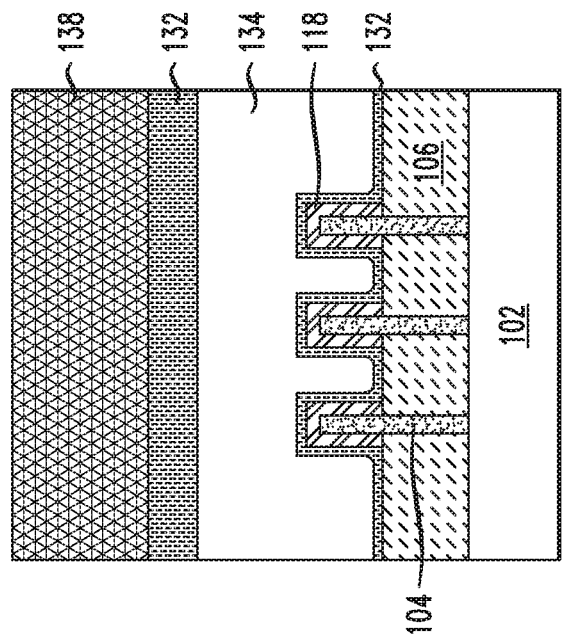
FIG. 13B depicts a cross-sectional view of the semiconductor device, taken along the line 13B-13B of FIG. 13A, in accordance with an illustrative embodiment.
Figure 13C:
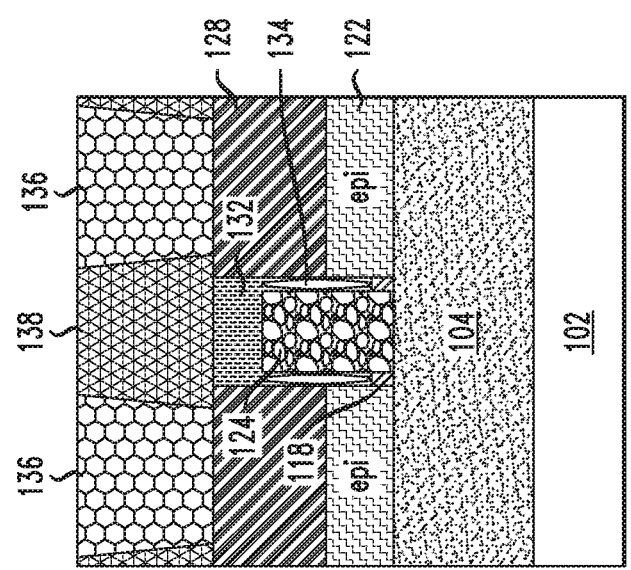
FIG. 13C depicts a cross-sectional view of the semiconductor device, taken along the line 13C-13C of FIG. 13A, in accordance with an illustrative embodiment.

Referring now FIGS. 13A-13C, FIG. 13A depicts a plan view of the semiconductor device 100 after further processing; FIG. 13B is a cross-sectional view of the semiconductor device 100 taken along the line 13B-13B of FIG. 13A; and FIG. 13C is a cross-sectional view of the semiconductor device taken along the line 13C-1C of FIG. 13A. In this exemplary embodiment, contacts 136 and interlayer dielectric 138 are formed on the top surface of trench contact 128 and dielectric layer 132 by known techniques and materials. It is understood that other steps other than these may be employed for further processing.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor device comprising:
   a functional gate structure disposed on a channel region of a fin structure;
   a source/drain region disposed on each side of the functional gate structure, wherein the functional gate structure comprises an insulator material abutting a portion of the sidewalls of the functional gate structure and the source drain region and a top surface of the fin structure: wherein the functional gate structure further comprises a dielectric top layer, wherein the did earl c top layer seals an air gap between the top surface of the insulator material and the dielectric top layer;
   a trench contact disposed on a top surface of each source/drain region;

an interlayer dielectric layer disposed on a top surface of the dielectric top layer and a portion of a top surface of each of the trench contacts; and a metal contact disposed on the top surface of each of the trench contacts.

2. The semiconductor device of claim 1, wherein the fin structure comprises a semiconductor portion, and the semiconductor portion of the fin structure comprises a group IV semiconductor material, a group II semiconductor material, a group VI semiconductor material, a group III semiconductor material, and a group V semiconductor material, or combinations thereof.

3. The semiconductor device of claim 1, wherein the insulator material is a low-k insulator material.

4. The semiconductor device of claim 3, wherein the low-k insulator material is silicon oxycarbide.

5. The semiconductor device of claim 1, wherein the source/drain region is an epitaxially grown source/drain on the fin structure.

6. The semiconductor device of claim 1, wherein the dielectric top layer comprises a nitride dielectric material.

7. The semiconductor device of claim 1, wherein the gate structure comprises a metal material.

8. The semiconductor device of claim 1, wherein the air gap is continuous from the top surface of the insulator material to a pinch-off region defined by an underlying surface of the dielectric top layer that seals the air gap.

9. The semiconductor device of claim 1, wherein the trench contact comprises an electrically conductive fill material.

10. An integrated circuit comprising:
one or more semiconductor devices, wherein at least one of the one or more semiconductor device comprises:
a functional gate structure disposed on a channel region of a fin structure;
a source/drain region disposed on each side of the functional gate structure, wherein the functional gate structure comprises an insulator material abutting a portion of the sidewalls of the functional gate structure and the source drain region and a top surface of the fin structure: wherein the functional gate structure further comprises a dielectric top layer, wherein the dielectric top layer seals an air gap between the top surface of the insulator material and the dielectric top layer;
a trench contact disposed on a top surface of each source/drain region;
an interlayer dielectric layer disposed on a top surface of the dielectric top layer and a portion of a top surface of each of the trench contacts; and
a metal contact disposed on the top surface of each of the trench contacts.

11. The integrated circuit of claim 10, wherein the fin structure comprises a semiconductor portion, and the semiconductor portion of the fin structure comprises a group IV semiconductor material, a group II semiconductor material, a group VI semiconductor material, a group III semiconductor material, and a group V semiconductor material, or combinations thereof.

12. The integrated circuit of claim 10, wherein the insulator material is a low-k insulator material.

13. The integrated circuit of claim 10, wherein the dielectric top layer comprises a nitride dielectric material.

14. The integrated circuit of claim 10, wherein the gate structure comprises a metal material.

15. The integrated circuit of claim 10, wherein the trench contact comprises an electrically conductive fill material.

16. The integrated circuit of claim 10, wherein the air gap is continuous from the top surface of the insulator material to a pinch-off region defined by an underlying surface of the dielectric top layer that seals the air gap.

17. The semiconductor device of claim 7, wherein the metal material is tantalum or tantalum nitride.

18. The semiconductor device of claim 9, wherein the electrically conductive fill material is selected from the group consisting of tungsten, copper, aluminum, silver, gold and alloys thereof.

19. The integrated circuit of claim 14, wherein the metal material is tantalum or tantalum nitride.

20. The integrated circuit of claim 15, wherein the electrically conductive fill material is selected from the group consisting of tungsten, copper, aluminum, silver, gold and alloys thereof.

* * * * *